(12) United States Patent
Lovett

(10) Patent No.: US 7,710,805 B2
(45) Date of Patent: May 4, 2010

(54) MAINTENANCE OF AMPLIFIED SIGNALS USING HIGH-VOLTAGE-THRESHOLD TRANSISTORS

(75) Inventor: Simon Lovett, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 98 days.

(21) Appl. No.: 12/027,824

(22) Filed: Feb. 7, 2008

(65) Prior Publication Data

US 2009/0201755 A1 Aug. 13, 2009

(51) Int. Cl.
*G11C 7/00* (2006.01)
(52) U.S. Cl. ...................... 365/205; 365/149
(58) Field of Classification Search ................. 365/149, 365/205
See application file for complete search history.

(56) References Cited

U.S. PATENT DOCUMENTS 6,088,275 A * 7/2000 Tanaka ......................... 365/205
2007/0097765 A1 * 5/2007 Huang et al. ................. 365/205

* cited by examiner

*Primary Examiner*—Hoai V Ho
(74) *Attorney, Agent, or Firm*—Leffert Jay & Polglaze, P.A.

(57) ABSTRACT

Systems, apparatus, memory devices, sense amplifiers and methods are provided, such as a system that includes an input node, a first transistor having a gate that couples to the input node, and a second transistor having another gate that couples to the input node. In one or more embodiments, the second transistor has a greater activation voltage threshold than does the first transistor and the first transistor amplifies a signal that is present on the input node. In one such embodiment, after the first transistor amplifies the signal, the second transistor maintains the amplified signal on the input node while the first transistor is deactivated.

23 Claims, 2 Drawing Sheets

MAINTENANCE OF AMPLIFIED SIGNALS USING HIGH-VOLTAGE-THRESHOLD TRANSISTORS

BACKGROUND

Sense amplifiers are often used in memory devices, such as Dynamic Random Access Memory (DRAM) devices, to amplify low-voltage signals read from memory cells. Sense amplifiers generally contain multiple transistors. Because the signals read from the memory cells are low-voltage signals, these transistors are often fabricated to be sensitive to small voltages. However, sensitive transistors often leak current, thereby wasting power.

BRIEF DESCRIPTION OF THE DRAWINGS

For a detailed description of illustrative embodiments of the invention, reference will now be made to the accompanying drawings in which.

NOTATION AND NOMENCLATURE

Figure 1:
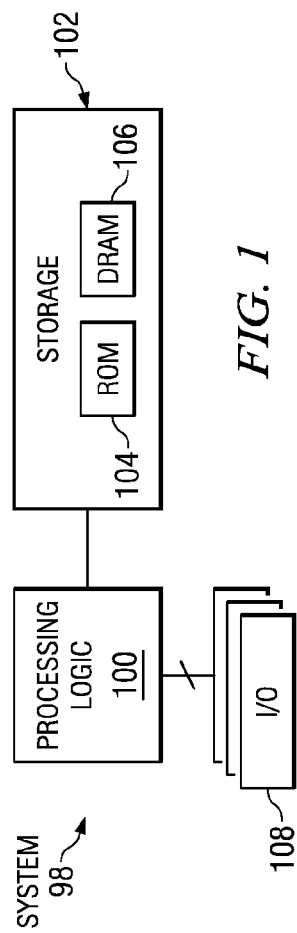
FIG. 1 shows an illustrative electronic system in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. The term "connection" refers to any path via which a signal may pass. For example, the term "connection" includes, without limitation, wires, traces and other types of electrical conductors, optical devices, etc. The term "system" may include a memory device or any suitable system that implements memory devices, such as a desktop computer, a laptop or notebook computer, a server, an electronic imaging device, an electronic video device, an electronic audio device, a printer, and other such electronic devices. The term "maintain" may be construed to denote the act of keeping something (e.g., voltage, current) steady, relatively steady, constant, relatively constant, or a similar meaning.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be illustrative of that embodiment, and not intended to intimate that the scope of the disclosure, including the claims, is limited to that embodiment.

Disclosed herein is, among other things, a sense amplifier that detects and amplifies low-voltage signals read from storage devices (e.g., Dynamic Random Memory Access (DRAM) devices) while conserving power. In at least some embodiments, the sense amplifier comprises two p-channel transistors and four n-channel transistors. Two of the n-channel transistors have low threshold voltage levels, while the remaining two n-channel transistors have relatively higher threshold voltage levels. One of the two low-threshold-voltage n-channel transistors is used to sense and amplify a low-voltage signal read from memory. The low-threshold-voltage transistor is then shut off and one of the high-threshold-voltage n-channel transistors is used to maintain the amplified voltage. Because the high-threshold-voltage transistor leaks less current than does the low-threshold-voltage transistor, power is conserved.

FIG. 1 shows an illustrative electronic system 98. The electronic system 98 comprises any suitable system that implements memory devices, such as a desktop computer, a laptop or notebook computer, a server, an electronic imaging device, an electronic video device, an electronic audio device, a printer, etc. The electronic system 98 comprises processing logic 100 (e.g., a processor), storage 102 and a plurality of input/output I/O devices 108 (e.g., keys, displays). The storage 102 comprises various types of memory devices, such as read-only memory (ROM) 104, DRAM 106, etc. When executing software or performing some other task, the processing logic 100 may access data stored in the storage 102. For example, the processing logic 100 may read data stored in the DRAM 106.

Figure 2:
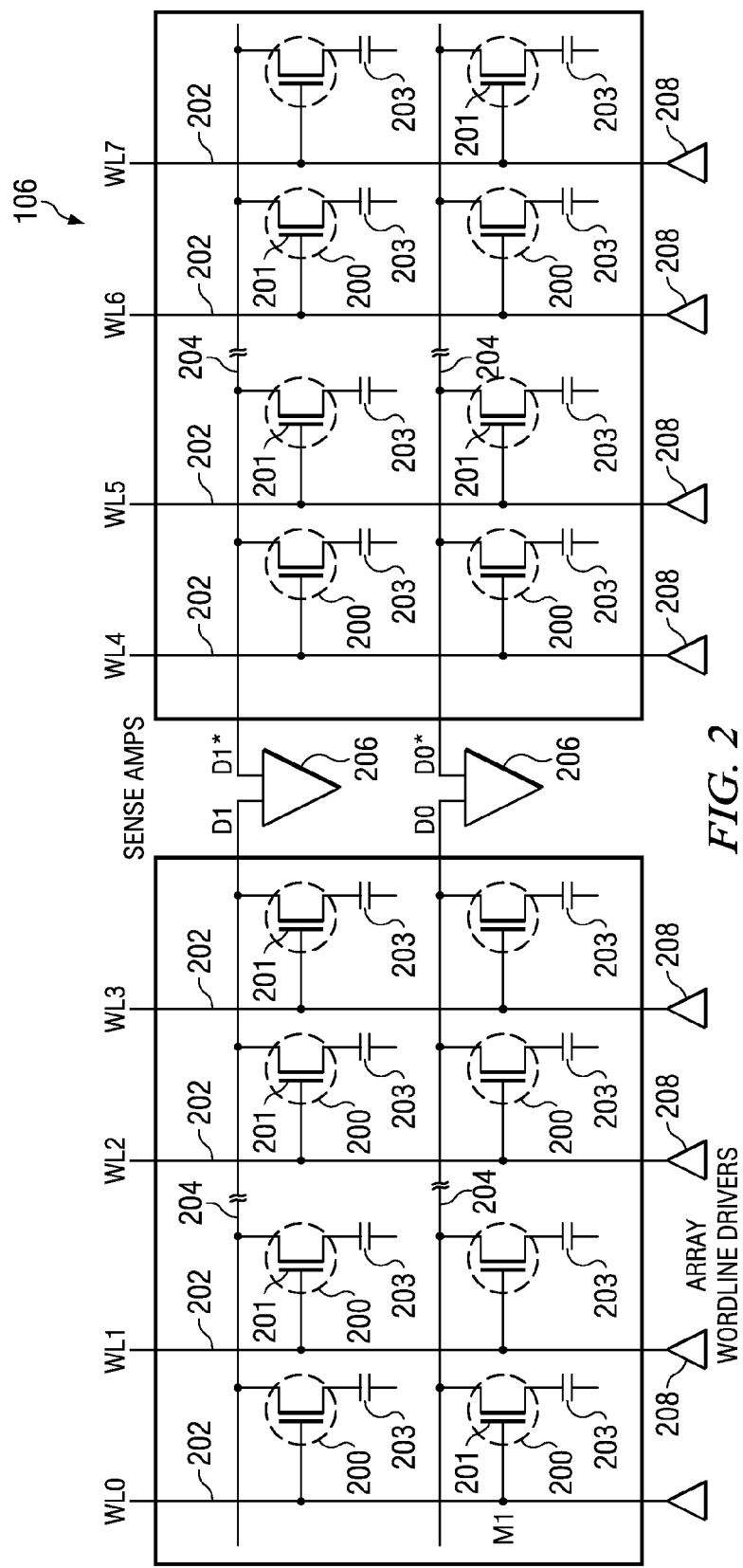
FIG. 2 shows an illustrative storage device, in accordance with various embodiments.

FIG. 2 shows a detailed view of an illustrative DRAM 106. The DRAM 106 shown in FIG. 2 is an open DRAM array, although, as described below, other types of DRAM arrays (e.g., folded DRAM arrays) and other types of memory in general (e.g., Synchronous DRAM (SDRAM), RAM) may be used. The DRAM 106 comprises a plurality of memory cells 200, access lines (such as word lines 202), data lines (such as digit lines 204), sense amplifiers 206 and word line drivers 208 used to drive the word lines 202. The memory cells 200 are arranged in an array, e.g., grid, format. Each memory cell 200 comprises an access device, such as transistor 201, and a capacitor 203. Charge stored by the capacitor 203, which may represent a digit (e.g., bit) of data, may be read by activating the transistor 201. The transistor 201 is activated using word lines 202 and digit lines 204. By activating and/or deactivating the word lines 202 and digit lines 204 such that a sufficient voltage is applied across the transistor 201, the transistor 201 is activated and permits the charge stored by the capacitor 203 to be read. Charge may be written to the capacitor 203 in a similar manner, such as to "store" a digit of data.

Data read from a capacitor 203 of a memory cell 200 is transferred along a digit line 204 to a sense amplifier 206. The sense amplifier receives the data in the form of a low-voltage signal, amplifies the signal and outputs the amplified signal back onto the digit line 204. In this way, the amplified signal not only is available for subsequent output, but also refreshes the memory cell 200 from which the original, low-voltage data signal was read.

Figure 3:
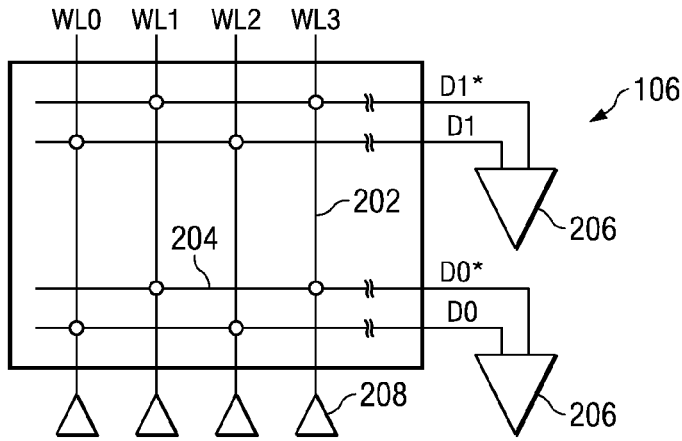
FIG. 3 shows another illustrative storage device, in accordance with various embodiments.

FIG. 3 shows another illustrative DRAM 106. The DRAM 106 shown in FIG. 3 comprises a folded-DRAM array. Like the DRAM 106 shown in FIG. 2, the DRAM 106 of FIG. 3 comprises word lines 202, digit lines 204, sense amplifiers 206 and word line drivers 208 (although present, the memory cells 200 are not shown in the figure for brevity). However, in the DRAM 106 of FIG. 3, the sense amplifiers 206 couple to the word lines 202 and digit lines 204 in an alternating fashion, as shown. Implementation of the sense amplifier disclosed herein in any and all such variations on DRAM, SDRAM, RAM, and other memory devices are encompassed within the scope of this disclosure.

Figure 4:
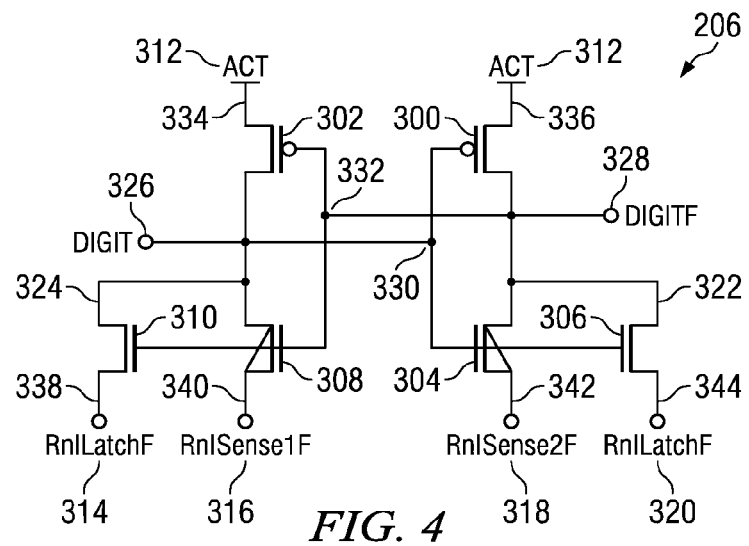
FIG. 4 shows an illustrative sense amplifier, in accordance with various embodiments.

FIG. 4 shows an illustrative sense amplifier 206. The sense amplifier 206 comprises p-channel transistors 300 and 302, n-channel transistors 304, 306, 308 and 310, an active pull-up power supply signal (hereinafter "ACT") 312, a RnlLatchF signal 314, a RnlSenseF signal 316, a RnlSense2F signal 318, and a RnlLatchF signal 320. The sense amplifier 206 further comprises nodes 322, 324, 326, 328, 330, 332, 334, 336, 338, 340, 342 and 344. In at least some embodiments, the nodes 316 and 318 are kept separate (i.e., the nodes 316 and 318 are not coupled together and/or the nodes 316 and 318 are not connected together). Further, in at least some embodiments, the p-channel transistors could be replaced with n-channel transistors, and vice versa.

Figure 5:
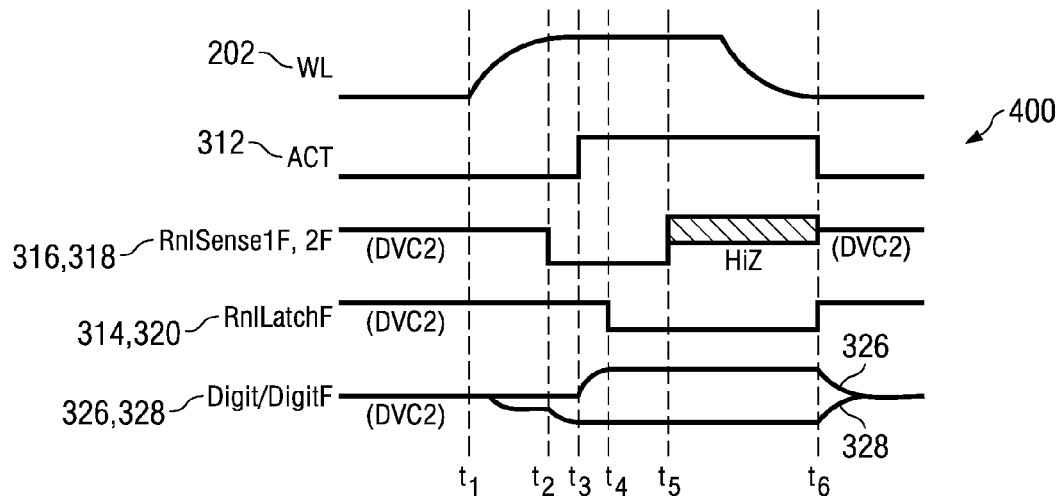
FIG. 5 shows a timing diagram associated with the devices of FIGS. 2 and 3 and the sense amplifier of FIG. 4, in accordance with various embodiments.

In at least some embodiments, the n-channel transistors 304 and 308 have low threshold voltages (e.g., 0.2 V to 0.3 V). These voltages may be identical or similar and referred to as $V_{t1}$. In some such embodiments, the n-channel transistors 306 and 310 have relatively higher threshold voltages (e.g., 0.4 V to 0.5 V) when compared to the threshold voltages of the transistors 304 and 308. In some embodiments, the difference between threshold voltages for the transistors 304, 308 and the transistors 306, 310 may be 0.1 V to 0.3 V. These voltages may be identical or similar and referred to as $V_{t2}$. As described in detail below, the low-threshold-voltage transistors 304 and 308 are used at least in part because they are sensitive to the low-voltage signals read from memory cells 200 in DRAM 106. However, because these transistors 304 and 308 leak current when DRAM page(s) corresponding to the transistors 304 and/or 308 are activated, in one or more embodiments, the transistors 304 and 308 are used only to sense and amplify the low-voltage signals. In one or more embodiments, neither of the transistors 304 and 308 is used to maintain an amplified signal on the digit line 204. Instead, after one of the low-threshold-voltage transistors 304 or 308 has sensed the low-voltage signal and amplified the low-voltage signal (as described below), that transistor 304 or 308 is shut down once a corresponding one of the high-threshold-voltage transistors 306 and 310 is activated. Once activated, that high-threshold-voltage transistor 306 or 310 maintains the amplified signal on the node 322 or 324. FIG. 5 is now briefly described, followed by an illustrative description of the operation of the sense amplifier 206 with reference to both FIGS. 4 and 5.

FIG. 5 shows an illustrative timing diagram 400 of the word line (WL) 202, ACT 312, RnlSense1F 316, RnlSense2F 318, RnlLatchF 314, 320, Digit 326 and DigitF 328 signals. Specific instants of time that are described below include $t_1$-$t_6$. Referring now to FIGS. 4 and 5, the sense amplifier 206 receives low-voltage signals on nodes 324 and 322 from digit lines 204 (shown in FIGS. 2-3). The low-voltage signals received on nodes 324 and 322 generally are slightly different from each other, so that a voltage potential is generated between the nodes 324 and 322. This voltage differential between nodes 324 and 322 is shown between $t_1$ and $t_2$ (refer to the Digit signal 326 and DigitF signal 328) when WL 202 is activated. At $t_2$, WL 202 reaches its maximum voltage level, meaning that the low-voltage signals Digit and DigitF on nodes 324 and 322 have stabilized and are ready to be amplified.

Accordingly, at time t2, circuit logic (not shown) coupled to the signals 314, 316, 318 and 320 causes the RnlSense1F signal 316 and RnlSense2F signal 318 to be dropped from Vcc/2 to LOW (e.g., to a reference potential such as ground (GND)), as shown in FIG. 5. As the voltage difference between RnlSense1F signal 316 at node 340 and the Digit signal 326 at node 324 approaches Vtl, and as the voltage difference between RnlSense2F signal 318 at node 342 and the DigitF signal 328 at node 322 approaches Vtl, the n-channel transistor 304, 308 whose gate is coupled to the higher voltage line begins to conduct. Stated otherwise, because the voltages on nodes 340 and 342 are the same or substantially similar, the first transistor 304 or 308 to have an activation voltage develop across it that surpasses Vtl will be activated before the other. In turn, the activated transistor 304 or 308 begins conducting current, thereby discharging the lower voltage line (i.e., either node 324 or 322). When the lower voltage line is discharged, it causes the p-channel transistor 300 or 302 to which it is coupled to be activated. The activated p-channel transistor conducts current between ACT 312 (e.g., a HIGH power supply signal) and the higher voltage line (i.e., either node 322 or 324). In this way, the higher voltage line is amplified from a weak HIGH signal to a strong HIGH signal.

For example, assume that a greater voltage signal is present at node 324 than at node 322. Accordingly, the n-channel transistor 304 will be activated before the n-channel transistor 308 is activated. When the n-channel transistor 304 is activated, current may flow between nodes 342 and 328. Because node 342 is at GND, node 322 is pulled toward GND as well. The transition of node 322 toward GND is shown between $t_2$ and $t_3$ in FIG. 5 (DigitF signal 328). Once node 322 is at GND, it provides a strong, LOW signal (relative to the low-voltage signal previously read from a memory cell 200) that is provided to node 332. Because node 332 is LOW, n-channel transistor 308 remains inactivated, but p-channel transistor 302 is activated. At this point, the ACT signal 312 (previously inactivated to conserve power, for example) is activated, as shown at $t_3$ in FIG. 5. When p-channel transistor 302 is activated, the node 324 is pulled up high by ACT signal 312, as shown by Digit signal 326 between $t_3$ and $t_4$. In turn, this HIGH signal is provided to node 330, which reinforces the activation of the n-transistor 304.

At $t_4$, both Digit 326 and DigitF 328 have reached full rail and need no further amplification. Accordingly, to minimize leakage via the activated n-channel transistor 304 or 308, the RnlLatchF signals 314 and 320 are asserted LOW so as to activate one of the high-voltage-threshold n-channel transistors 306 or 310. Neither of these transistors 306 or 310 was previously activated because $V_{t2}$ had not been established across either one of these transistors. However, now that the signals on nodes 324 and 322 are amplified, and RnlLatchF 314 and 320 are pulled to GND, $V_{t2}$ is established across one of the transistors 306 or 310 (i.e., the transistor 306 or 310 whose gate couples to ACT signal 312; in the present example, transistor 306 would be activated and transistor 310 would remain inactive). In this way, the "responsibility" for maintaining the amplified voltage signals is transferred from the activated n-channel transistor 304 or 308 to the activated n-channel transistor 306 or 310. This transfer may be observed in FIG. 5.

Specifically, at $t_5$, the RnlSense1F and 2F signals 316 and 318 are increased above GND so that the activation voltage $V_{t1}$ no longer exists across either of the n-channel transistors 304 or 308. Thus, at $t_5$, both of the n-channel transistors 304 and 308 are inactive. However, as shown, despite the transistors 304 and 308 being shut off, the signals on nodes 324 and 322 maintain their amplified states, because these amplified signals are maintained by the active p-channel transistor 302 (i.e., for the HIGH signal on node 324) and the active n-channel transistor 306 (i.e., for the LOW signal on node 322). During the time interval between $t_5$ and $t_6$, the low-voltage-threshold transistors 304 and 308 are off, thereby preventing current leakage, while the high-voltage-threshold transistor 306 is on, thereby maintaining the amplified signal on the nodes 322. However, at $t_6$, when the transistor 306 is shut off so that all n-channel transistors are inactive, the nodes 322 loses its amplified signal and returns to its original state, as observed by comparing the signal on node 322 prior to $t_1$ and after $t_6$. Similarly, at $t_6$, when the ACT signal 312 is shut off, the node 324 loses its amplified signal and returns to its original state, as observed by comparing the signal on node 324 prior to $t_1$ and after $t_6$.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system, comprising:
   an input node;
   a first transistor having a gate that couples to the input node; and
   a second transistor coupled in parallel with the first transistor and having a gate that couples to the input node, the second transistor has a greater activation voltage threshold than does the first transistor;
   wherein the first transistor amplifies a signal that is present on the input node; and
   wherein, at least partially in response to the first transistor amplifying the signal, the second transistor maintains the amplified signal on the input node while the first transistor is deactivated.

2. The system of claim 1, wherein the second transistor is inactive for at least part of a time during which the first transistor amplifies the signal, and wherein the first transistor is inactive for at least part of a time during which the second transistor maintains the amplified signal on the input node.

3. The system of claim 1, wherein the first and second transistors are of a same type of transistor, where the type of transistor is selected from the group consisting of n-channel transistors and p-channel transistors.

4. The system of claim 1, wherein the system comprises an apparatus selected from the group consisting of a DRAM memory device, a desktop computer, a notebook computer, a server, an electronic imaging device, an electronic video device, an electronic audio device and a printer.

5. The system of claim 1, wherein a difference between activation voltage thresholds for the first and second transistors is at least 50 millivolts.

6. An apparatus, comprising:
   a first input node that couples to gates of first and second transistors, the first transistor has a lower threshold voltage than does the second transistor;
   a second input node that couples to gates of third and fourth transistors, the third transistor has a lower threshold voltage than does the fourth transistor, the second input node receives a different input signal than does the first input node;
   wherein one of the first and third transistors amplifies a voltage signal and is deactivated after amplifying the voltage signal;
   wherein, at least partially in response to the deactivation of the one of the first and third transistors, one of the second and fourth transistors maintains the amplified voltage signal; and
   wherein the first, second, third and fourth transistors are of a same type of transistor, where the type of transistor is selected from the group consisting of n-channel transistors and p-channel transistors.

7. The apparatus of claim 6, wherein either sources of the first and third transistors are not coupled to each other or drains of the first and third transistors are not coupled to each other.

8. The apparatus of claim 6, wherein, after the one of the first and third transistors amplifies the voltage signal, the one of the second and fourth transistors is activated prior to deactivating the one of the first and third transistors.

9. The apparatus of claim 6, wherein at least one of the second and fourth transistors leaks less current than does at least one of the first and third transistors.

10. The apparatus of claim 6, wherein the threshold voltages of the first and third transistors differ from the threshold voltages of both of the second and fourth transistors by at least 0.1 V.

11. The apparatus of claim 6, wherein the apparatus comprises a device selected from the group consisting of Dynamic Random Access Memory (DRAM) and a computer.

12. A memory device, comprising:
   a plurality of memory cells;
   an amplifier coupled to at least one of the plurality of memory cells via a first data line and to another one of the plurality of memory cells via a second data line, the amplifier comprises a first pair of transistors and a second pair of transistors, where the first pair of transistors have threshold voltages lower than those of the second pair of transistors;
   wherein the first pair of transistors is adapted to amplify signals received via the first data line and the second data line;
   wherein the second pair of transistors is adapted to maintain the amplified signals after the first pair of transistors has been deactivated;
   wherein a first transistor of the first pair of transistors is coupled in parallel with a first transistor of the second pair of transistors and a second transistor of the first pair of transistors is coupled in parallel with a second transistor of the second pair of transistors; and
   wherein the first pair and second pair of transistors are of a same type of transistor, where the type of transistor is selected from the group consisting of n-channel transistors and p-channel transistors.

13. The memory device of claim 12, wherein the memory device is selected from the group consisting of Dynamic Random Access Memory (DRAM) and Synchronous DRAM (SDRAM).

14. The memory device of claim 12, wherein the memory device comprises one of an open-DRAM array and a folded-DRAM array.

15. The memory device of claim 12, wherein the first and second data lines comprise first and second digit lines and where one of the first pair of transistors drives one of the first digit line and the second digit line LOW, and wherein one of the second pair of transistors maintains the one of the first digit line and the second digit line LOW, and each of the second pair of transistors leaks less current than does each of the first pair of transistors.

16. The memory device of claim 12, wherein the threshold voltages of the first pair of transistors differ from the threshold voltages of the second pair of transistors by at least 0.1 V.

17. A sense amplifier, comprising:
- a first p-channel transistor, a first node of the first p-channel transistor coupled to a voltage source and a second node of the first p-channel transistor coupled to a data line;
- a second p-channel transistor, a first node of the second p-channel transistor coupled to the voltage source and a second node of the second p-channel transistor coupled to another data line;
- a first n-channel transistor, a first node of the first n-channel transistor coupled to the data line and a second node of the first n-channel transistor coupled to a sense control signal;
- a second n-channel transistor, a first node of the second n-channel transistor coupled to the another data line and a second node of the second n-channel transistor coupled to another sense control signal separate from the sense control signal;
- a third n-channel transistor, a first node of the third n-channel transistor coupled to the data line and a second node of the third n-channel transistor coupled to a latch control signal;
- a fourth n-channel transistor, a first node of the fourth n-channel transistor coupled to the another data line and a second node of the fourth n-channel transistor coupled to the latch control signal;
- wherein gates of the first p-channel transistor, first n-channel transistor and third n-channel transistor couple to the another data line;
- wherein gates of the second p-channel transistor, second n-channel transistor and fourth n-channel transistor couple to the data line;
- wherein the third and fourth n-channel transistors have threshold activation voltages that are greater than the threshold activation voltages of the first and second n-channel transistors.

18. The amplifier of claim 17, wherein one of the third and fourth n-channel transistors is activated only if one of the first and second n-channel transistors amplifies signals on the data line and the another digit line to exceed the threshold activation voltage of the one of the third and fourth n-channel transistors.

19. The amplifier of claim 17, wherein the threshold activation voltages for the first and second n-channel transistors differ from the threshold activation voltages for the third and fourth n-channel transistors by at least 0.1 V.

20. The amplifier of claim 17, wherein, at least partially in response to one of the third and fourth transistors beginning to maintain a voltage signal amplified by one of the first and second transistors, voltage across the one of the first and second transistors is decreased so that the voltage signal is maintained by the one of the third and fourth transistors and not by the first transistor or the second transistor.

21. The amplifier of claim 17, wherein the sense control signal and the another sense control signal are substantially identical.

22. A method, comprising:
- receiving a first signal from a memory cell and a second signal from another memory cell, the first signal at a higher voltage level than the second signal;
- activating a first n-channel transistor coupled to the second signal and to a reference potential, thereby pulling the second signal toward the reference potential;
- activating a p-channel transistor coupled to the first signal and to a voltage source, thereby pulling the first signal toward a voltage of the voltage source;
- activating a second n-channel transistor coupled to the second signal and to the reference potential that maintains the second signal at the reference potential; and
- de-activating the first n-channel transistor;
- wherein a threshold voltage for the first n-channel transistor is less than a threshold voltage for the second n-channel transistor.

23. The method of claim 22, wherein a difference between activation voltage thresholds for the first n-channel transistor and the second n-channel transistor is at least 0.1 V.

* * * * *